United States Patent
Chu et al.

(10) Patent No.: US 10,661,394 B2
(45) Date of Patent: May 26, 2020

(54) METAL CORE SOLDER BALL AND HEAT DISSIPATION STRUCTURE FOR SEMICONDUCTOR DEVICE USING THE SAME

(71) Applicant: Duksan Hi-Metal CO., LTD, Ulsan (KR)

(72) Inventors: Yong Cheol Chu, Ulsan (KR); Hyun Kyu Lee, Ulsan (KR); Jung Ug Kwak, Ulsan (KR); Seung Jin Lee, Ulsan (KR); Sang Ho Jeon, Ulsan (KR); Yong Sik Choi, Ulsan (KR)

(73) Assignee: DUKSAN HI-METAL CO., LTD., Ulsan (KR)

( * ) Notice: Subject to any disclaimer, the term of this patent is extended or adjusted under 35 U.S.C. 154(b) by 0 days.

(21) Appl. No.: 14/082,339

(22) Filed: Nov. 18, 2013

(65) Prior Publication Data
US 2014/0183733 A1   Jul. 3, 2014

(30) Foreign Application Priority Data
Jan. 3, 2013 (KR) .................. 10-2013-0000777

(51) Int. Cl.
*B23K 35/02* (2006.01)
*B23K 35/28* (2006.01)
(Continued)

(52) U.S. Cl.
CPC ........ *B23K 35/0244* (2013.01); *B23K 35/282* (2013.01); *B23K 35/286* (2013.01);
(Continued)

(58) Field of Classification Search
CPC ............ B23K 35/0244; B23K 35/3033; B23K 35/282; B23K 35/3013; B23K 35/30; B23K 35/286; B23K 35/302; B23K 35/3006; H01L 23/488; H01L 23/492; H01L 23/34; H01L 24/16; H01L 24/26; H01L 33/62; H01L 23/49816; H01L 24/13; H01L 24/14; H01L 2224/16; H01L 24/10–24/17;
(Continued)

(56) References Cited

U.S. PATENT DOCUMENTS 5,118,027 A * 6/1992 Braun ............... B23K 1/20
228/180.22
6,286,206 B1 * 9/2001 Li ......................... 29/840
(Continued)

FOREIGN PATENT DOCUMENTS

JP   2002057177 A * 2/2002
JP   2006026745 A * 2/2006
(Continued)

OTHER PUBLICATIONS

Uher, Ctirad, "Thermal conductivity of metals", 2004, in Thermal Conductivity, pp. 27-29.*

*Primary Examiner* — Thanhha S Pham
(74) *Attorney, Agent, or Firm* — Conley Rose, P.C.; Rodney B. Carroll

(57) ABSTRACT

Disclosed is a metal core solder ball having improved heat conductivity, including a metal core having a diameter of 40~600 μm, a first plating layer formed on the outer surface of the metal core, and a second plating layer formed on the outer surface of the first plating layer.

2 Claims, 2 Drawing Sheets

(51) Int. Cl.
*B23K 35/30* (2006.01)
*H01L 23/00* (2006.01)
*H01L 23/498* (2006.01)
*H05K 3/34* (2006.01)
*B23K 101/36* (2006.01)

(52) U.S. Cl.
CPC ............ *B23K 35/30* (2013.01); *B23K 35/302* (2013.01); *B23K 35/3006* (2013.01); *B23K 35/3013* (2013.01); *B23K 35/3033* (2013.01); *H01L 24/13* (2013.01); *B23K 2101/36* (2018.08); *H01L 23/49816* (2013.01); *H01L 24/16* (2013.01); *H01L 24/81* (2013.01); *H01L 2224/0401* (2013.01); *H01L 2224/05147* (2013.01); *H01L 2224/05155* (2013.01); *H01L 2224/05644* (2013.01); *H01L 2224/13124* (2013.01); *H01L 2224/13139* (2013.01); *H01L 2224/13144* (2013.01); *H01L 2224/13147* (2013.01); *H01L 2224/13561* (2013.01); *H01L 2224/13582* (2013.01); *H01L 2224/13611* (2013.01); *H01L 2224/13655* (2013.01); *H01L 2224/16* (2013.01); *H01L 2224/16227* (2013.01); *H01L 2224/81447* (2013.01); *H01L 2924/3656* (2013.01); *H05K 3/3478* (2013.01); *H05K 2201/0218* (2013.01); *H05K 2203/041* (2013.01)

(58) Field of Classification Search
CPC ......... H01L 2224/10–1601; H05K 2201/0218; H05K 2203/041
USPC .......................................... 228/56.3; 257/738
See application file for complete search history.

(56) References Cited

U.S. PATENT DOCUMENTS

| | | | |
|---|---|---|---|
| 6,358,630 B1 * | 3/2002 | Tsukada et al. ............. | 428/646 |
| 6,518,667 B1 * | 2/2003 | Ichida et al. ................. | 257/738 |
| 7,351,599 B2 * | 4/2008 | Shen et al. ..................... | 438/26 |
| 2002/0000651 A1 * | 1/2002 | Takizawa ................ | H01L 24/02 |
| | | | 257/697 |
| 2002/0051728 A1 * | 5/2002 | Sato ...................... | B22F 1/0048 |
| | | | 420/562 |
| 2003/0127747 A1 * | 7/2003 | Kajiwara ................ | H01L 24/02 |
| | | | 257/778 |
| 2004/0115340 A1 * | 6/2004 | Griego .................... | H01F 41/16 |
| | | | 174/126.2 |
| 2006/0033214 A1 * | 2/2006 | Tomono ................ | H01L 21/563 |
| | | | 257/772 |
| 2006/0138444 A1 * | 6/2006 | Chio ....................... | H01L 33/62 |
| | | | 257/100 |
| 2007/0069379 A1 * | 3/2007 | Souma et al. ................ | 257/738 |
| 2008/0244900 A1 * | 10/2008 | Maeda et al. .................. | 29/840 |
| 2010/0084765 A1 * | 4/2010 | Lee et al. ..................... | 257/738 |
| 2010/0243300 A1 * | 9/2010 | Amin .................... | H05K 3/244 |
| | | | 174/257 |
| 2011/0115084 A1 * | 5/2011 | Ueshima et al. ............. | 257/738 |
| 2013/0133936 A1 * | 5/2013 | Yorita ..................... | H05K 1/09 |
| | | | 174/257 |

FOREIGN PATENT DOCUMENTS

| | | | |
|---|---|---|---|
| JP | 2007046087 A | * | 2/2007 |
| KR | 100395438 B1 | * | 8/2003 |

* cited by examiner

[Figure 1]
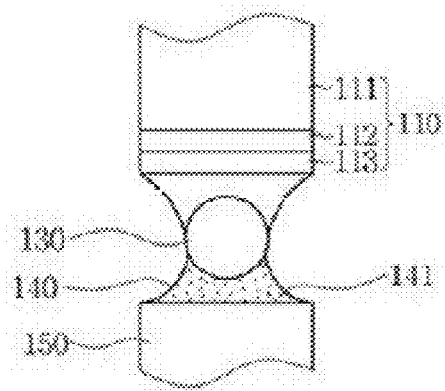
[Figure 2]
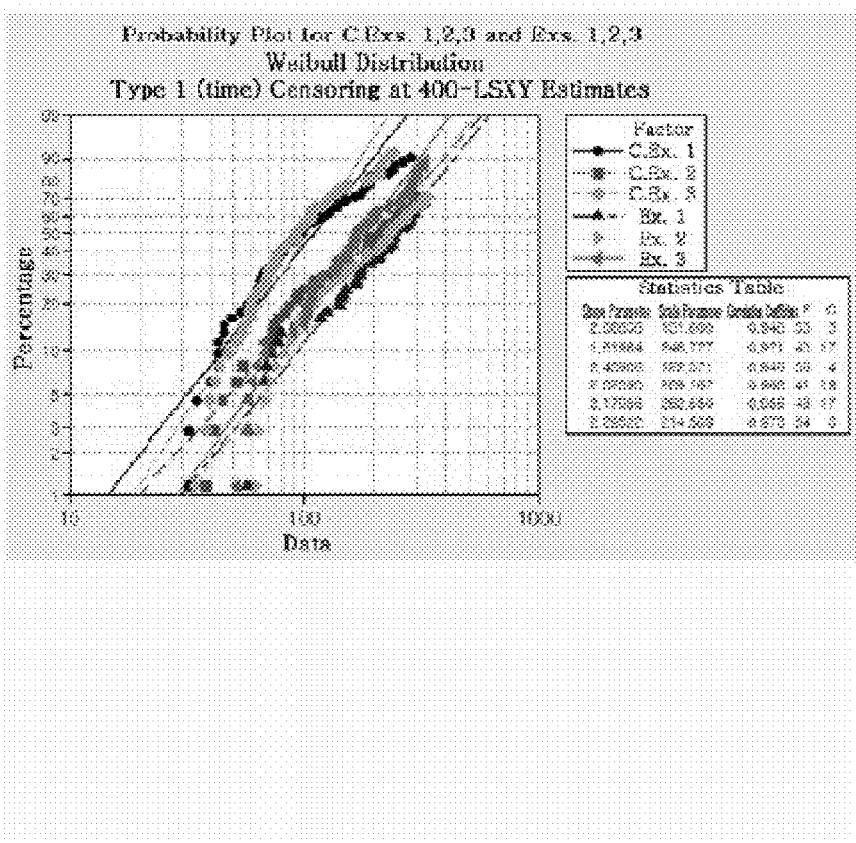

[Figure 3]
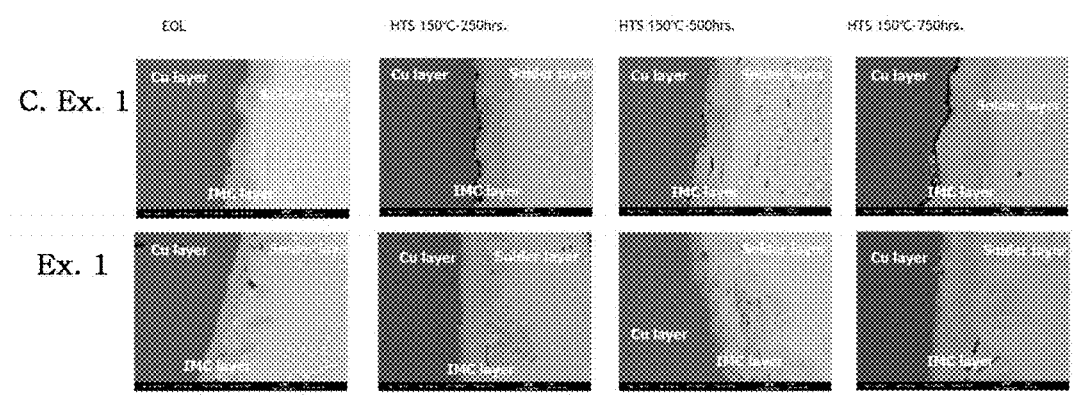

METAL CORE SOLDER BALL AND HEAT DISSIPATION STRUCTURE FOR SEMICONDUCTOR DEVICE USING THE SAME

CROSS-REFERENCE TO RELATED APPLICATION(S)

This application claims the benefit under 35 USC 119(a) of Korean Patent Application No. 10-2013-0000777 filed on Jan. 3, 2013, in the Korean Intellectual Property Office, the entire disclosure of which is incorporated herein by reference for all purposes.

BACKGROUND

1. Field of the Invention

The present invention relates to a metal core solder ball and a heat dissipation structure for a semiconductor device using the same.

2. Description of the Related Art

Useful as a next-generation high density package is a chip scale package (CSP) or a ball grid array (BGA), each of which has high mounting density. Typically, a solder ball is used to electrically connect a chip and a substrate.

Ensuring electrode reliability upon using a solder ball is considered important. To this end, a metal core solder ball comprising an inner core made of metal and a solder layer formed thereon is recently available, instead of the conventional solder ball. This is because the inner core of a metal core solder ball is not melted at a reflow temperature upon flip chip bonding, and a distance between a chip and a printed circuit board (PCB) is maintained thus obtaining high bonding reliability.

Meanwhile, because chips having high-density circuits thereon are manufactured these days, heat generated from semiconductor devices should be dissipated to the outside, which is regarded as very important. Conventionally, heat is dissipated in such a manner that a heat sink is provided to the semiconductor device. As such, TIM (Thermal Interface Material) is disposed at the interface between the heat sink and the semiconductor device, whereby heat is efficiently emitted from the semiconductor device to the heat sink.

However, no attempts have been made to dissipate heat generated from the semiconductor device toward the substrate thorough research thereto is insufficient. This is because when heat is emitted toward the substrate including many electronic elements, it may affect the electronic elements or heat conductivity of the solder ball which connects the substrate and the semiconductor device.

SUMMARY

Accordingly, the present invention has been made keeping in mind the above problems occurring in the related art, and an object of the present invention is to provide a metal core solder ball having high heat conductivity between a semiconductor device and a substrate to impart connection reliability between the semiconductor device and the substrate and to efficiently emit heat generated from the semiconductor device.

An aspect of the present invention provides a metal core solder ball, comprising a metal core having a diameter of 40~600 μm; a first plating layer formed on the outer surface of the metal core; and a second plating layer formed on the outer surface of the first plating layer, and satisfying the following Relation 1:

$$\tfrac{1}{6}a < aA + bB + cC < \tfrac{2}{3}a \qquad \text{[Relation 1]}$$

wherein a is heat conductivity of the metal core, b is heat conductivity of the first plating layer, c is heat conductivity of the second plating layer, A, B and C are volume ratios of the metal core, the first plating layer and the second plating layer, respectively, in the solder ball, $A+B+C=1$, $0.0005<B<0.05$, $0.7<C<0.94$, and A, B and C each are a real number between 0 and 1 in the entire solder ball.

As such, the metal core preferably comprises a metal selected from the group consisting of copper (Cu), silver (Ag), gold (Au) and aluminum (Al).

As such, the first plating layer is preferably formed by subjecting nickel (Ni) or a Ni alloy to electroless plating.

Furthermore, the second plating layer is preferably formed by electroplating a tin (Sn) alloy.

Another aspect of the present invention provides a heat dissipation structure for a semiconductor device, comprising the metal core solder ball as above.

As such, the heat dissipation structure is preferably configured such that the metal core solder ball is provided to connect the connection terminal of the semiconductor device and the electrode of a substrate.

As such, a bonding portion which connects the solder ball to the electrode preferably contains brass powder or silver powder.

A further aspect of the present invention provides an electronic device, comprising a connection terminal of a semiconductor device; an electrode of a substrate disposed to face the connection terminal; and a solder ball which thermally and electrically connects the connection terminal and the electrode of the substrate and satisfies the following Relation 1:

$$\tfrac{1}{6}a < aA + bB + cC < \tfrac{2}{3}a \qquad \text{[Relation 1]}$$

wherein a is heat conductivity of a metal core, b is heat conductivity of a first plating layer, c is heat conductivity of a second plating layer, A, B and C are volume ratios of the metal core, the first plating layer and the second plating layer, respectively, in the solder ball, $A+B+C=1$, $0.0005<B<0.05$, $0.7<C<0.94$, and A, B and C each are a real number between 0 and 1 in the entire solder ball.

As such, the electronic device preferably includes a bonding portion formed of brass powder or Ag powder between the electrode of the substrate and the solder ball.

BRIEF DESCRIPTION OF THE DRAWINGS

The above and other objects, features and advantages of the present invention will be more clearly understood from the following detailed description taken in conjunction with the accompanying drawings, in which:

FIG. 1 illustrates a heat dissipation structure for a semiconductor device using a metal core solder ball according to the present invention;

FIG. 2 illustrates the results of drop impact testing of Examples 1 to 3 and Comparative Examples 1 to 3; and FIG. 3 illustrates the results of observing Kirkendall voids in Example 1 and Comparative 1.

DETAILED DESCRIPTION

Hereinafter, a detailed description will be given of preferred embodiments of the present invention. In the following description, the terms "first," "second," and the like are used to explain various elements, and these terms are merely used to differentiate a certain element from other elements. In this application, the terms "comprise," "include" or "have" are used to designate the presence of features, steps or combinations thereof described in the specification, and should be understood so as not to exclude presence or additional probability of one or more different features, steps or combinations thereof. Unless otherwise defined, all of the terms used in the specification including technical or scientific terms are taken only to illustrate embodiments, and are not intended to limit the present invention.

Metal Core Solder Ball

According to an embodiment of the present invention, a metal core solder ball includes a metal core, a first plating layer, and a second plating layer.

The material for the metal core may include copper (Cu) powder, silver (Ag) powder, gold (Au) powder, and aluminum (Al) powder. As such, heat conductivity of the metal core is preferably 350~450 W/mk.

The metal core preferably has a diameter of 40~600 μm, and more preferably an average diameter of 40~250 μm.

As used herein, the metal core is typically spherical and the particle size thereof indicates a diameter. However, in the case where individual particles are not completely spherical, the size thereof is defined as an average value of the longest line segment that passes through the particles and the shortest line segment that passes through the particles. In the case where individual particles are close to spherical, the size thereof may approximate to the diameter of a sphere.

The first plating layer is formed on the outer surface of the metal core. The first plating layer is provided to control generation of an intermetallic compound at the interface of two metals which are bonded and to prevent diffusion of Kirkendall voids along the intermetallic compound due to atomic diffusion, and preferably has a thickness of 0.1~5 μm, and more preferably 0.5~2 μm.

The first plating layer preferably has a volume of 0.05~5% relative to the total volume of the solder ball. If the volume of the first plating layer is less than 0.1%, it is impossible to prevent the generation of Kirkendall voids and to control the growth of an intermetallic compound. In contrast, if the volume thereof exceeds 5%, the structure of a bonding layer is changed, which undesirably decreases reliability.

The first plating layer is preferably formed of nickel (Ni) or a Ni alloy. In particular, in order to control the formation of Kirkendall voids and to control the thickness of the bonding layer that is formed after reflow, a Ni—Ag alloy is preferably used. The first plating layer preferably has a heat conductivity of 80~100 W/mK.

The second plating layer is formed on the outer surface of the first plating layer, and may include tin (Sn) and a Sn alloy such as SnAg, SnAgCu, SnCu, SnZn, SnMg, SnAl, etc. When Sn is used alone, a reflow peak temperature may increase due to an increase in the melting point, which undesirably reduces the lifetime of other parts. However, the addition of Ag, Cu or the like preferably lowers the melting point. The second plating layer has a thickness of 10~50 μm, and has a volume of 70~94% relative to the total volume of the solder ball. If the volume of the second plating layer is less than 70%, reactivity with a pad may decrease, leading to a missing ball. In contrast, if the volume thereof exceeds 94%, voids may be generated in the second plating layer, and heat conductivity, drop impact performance and thermal impact performance may deteriorate.

As such, the second plating layer preferably has a heat conductivity of 60~80 W/mK.

Taking into consideration connection reliability and heat conductivity, the metal core, the first plating layer and the second plating layer as set forth are provided. Because heat conduction occurs throughout the solder ball unlike electrical conduction, it is preferred that a core having high electrical conductivity and a second plating layer be provided at high thickness, and the second plating layer be made of a metal having high heat conductivity.

The solder ball according to an embodiment of the present invention is manufactured so as to satisfy the following Relation 1. Thereby, both heat conductivity and connection reliability are fulfilled.

$$\tfrac{1}{6}a < aA + bB + cC < \tfrac{2}{3}a \quad \text{[Relation 1]}$$

In Relation 1, a is the heat conductivity of the metal core, b is the heat conductivity of the first plating layer, c is the heat conductivity of the second plating layer, A, B and C are volume ratios of the metal core, the first plating layer and the second plating layer, respectively, in the solder ball, $A+B+C=1$, $0.0005<B<0.05$, $0.7<C<0.94$, and A, B and C each are a real number between 0 and 1 in the entire solder ball.

The case where the metal core solder ball as above is manufactured is effective at ensuring connection reliability and increasing heat conductivity of the solder ball by at least five times compared to when using a typical solder ball.

Manufacture of Metal Core Solder Ball

A method of manufacturing the metal core solder ball includes providing a metal core, forming a first plating layer, and forming a second plating layer.

Upon providing the metal core, the metal core is prepared to have an average diameter of 40~600 μm corresponding to a desired size by passing a melt through an orifice. The material for the metal core may include copper (Cu) powder, silver (Ag) powder, gold (Au) powder, nickel (Ni) powder and aluminum (Al) powder.

The metal for the metal core is melted via induction heating using a high frequency induction furnace and is then passed through a predetermined orifice hole using an oscillator, thus manufacturing a metal core having a desired diameter. As such, the desired size may be adjusted by the frequency and pressure.

Upon forming the first plating layer, the manufactured metal core is pickled, treated with a palladium (Pd) solution so that a Pd seed is attached to the etched surface thereof, then activated with a dilute sulfuric acid solution, after which a first plating solution material heated in a water bath is loaded into an electroless plating solution and then stirred. Electroless plating is performed with continuous stirring until the reaction is completed. The reaction time may remarkably vary depending on the amount of the loaded material and the concentration and amount of the electroless plating solution, but is typically set to about 1~2 hr.

The first plating solution material may include Ni, Ni—P, Ni—B, Co and so on.

Upon forming the second plating layer, a metal containing Sn is electrolyzed on the surface of the metal core having the first plating layer to form a plating layer. Electroplating is carried out under conditions in which the metal core is placed in a barrel and a plating metal is located at the anode, and the metal core as a target to be plated is located at the cathode in the barrel. In this case, the temperature is maintained at 20~30° C. The plating time may be appropriately set depending on the size of the target.

The material for the second plating solution may include a Sn alloy, such as SnAg, SnAgCu, SnCu, SnZn, SnMg, SnAl, etc.

Heat Dissipation Structure for Semiconductor

A heat dissipation structure for a semiconductor device using the metal core solder ball according to the present invention includes the metal core solder ball which is provided between the connection terminal of the semiconductor device and the electrode of a substrate which is disposed to face the connection terminal of the semiconductor device so that the connection terminal and the pad are thermally and electrically connected.

The connection terminal of the semiconductor device is typically configured such that Ni/Au plating layers are formed on a Cu pad, but is not limited thereto. The metal core solder ball is adhered to the connection terminal while forming an intermetallic compound by heating the second plating layer to melt it. The semiconductor device having the metal core solder ball attached thereto is attached again to the electrode of the substrate.

The electrode of the substrate is typically formed of Cu but is not limited thereto. As such, the surface of Cu is preferably treated with OSP (Organic Solderability Preservative) in order to prevent oxidation thereof.

A solder paste is applied onto the electrode of the substrate, and thus the electrode and the metal core solder ball are attached via heating. The solder paste is composed of flux and conductive particles, and the flux removes the oxide film from the surface of the metal core solder ball to increase reactivity so that conductive particles of the solder paste are reacted with the metal core solder ball, thus forming a bonding portion to the electrode. As such, the solder paste preferably further includes metal powder such as brass, Ag, etc., in order to improve heat conductivity, and such powder preferably has a particle size of 3~15 μm.

Manufacture of Metal Core Solder Ball

A better understanding of the present invention regarding the metal core solder ball may be obtained through the following examples and comparative examples which are set forth to illustrate, but are not to be construed to limit the present invention.

Example 1: Manufacture of Metal Core Solder Ball

Cu was melted via induction heating using a high frequency induction furnace and then passed through a predetermined orifice hole using an oscillator, thus manufacturing a Cu core having a diameter of 40 μm. As such, the frequency was 200 Hz, and the pressure was 10 bar.

The Cu core was pickled, treated with a Pd solution so that a Pd seed was attached to the etched surface thereof, and then activated with a 15% dilute sulfuric acid solution. Thereafter, the Cu core was loaded into a Ni electroless plating solution heated in a water bath and then stirred until the reaction was completed.

As such, the amount of the loaded Cu core was 10 g, and pH of the Ni plating solution was 4~6. The reaction continued until the total volume of the Ni electroless plating solution was decreased to ½.

The reaction was further carried out for about 1 hr, thus forming a first plating layer about 1 μm thick having a volume of 0.01% relative to the total volume of the core solder ball.

The Cu core having the first plating layer was placed in a barrel, and Sn—Ag was positioned at the anode and the metal core was located at the cathode and thus electroplating was performed. As such, the temperature was maintained at 20~30° C. This electroplating was performed at a current density of 1 A/dm for 3 hr, thus forming a second plating layer 3 μm thick on one side having a volume of 90% relative to the total volume of the core solder ball, thereby manufacturing a metal core solder ball.

Example 2: Manufacture of Metal Core Solder Ball

Cu was melted via induction heating using a high frequency induction furnace and then passed through a predetermined orifice hole using an oscillator, thus manufacturing a Cu core having a diameter of 60 μm. As such, the frequency was 180 Hz, and the pressure was 8 bar.

The Cu core was pickled, treated with a Pd solution so that a Pd seed was attached to the etched surface thereof, and then activated with a 15% dilute sulfuric acid solution. Thereafter, the Cu core was loaded into a Ni electroless plating solution heated in a water bath and then stirred until the reaction was completed.

As such, the amount of the loaded Cu core was 40 g, and pH of the Ni plating solution was 4~6. The reaction continued until the total volume of the Ni electroless plating solution was decreased to ½.

The reaction was further carried out for about 1 hr, thus forming a first plating layer about 1 μm thick having a volume of 0.003% relative to the total volume of the core solder ball.

The Cu core having the first plating layer was placed in a barrel, and Sn—Ag was positioned at the anode and the metal core was located at the cathode and thus electroplating was performed. As such, the temperature was maintained at 20~30° C. This electroplating was performed at a current density of 1 A/dm for 3 hr, thus forming a second plating layer 30 μm thick on one side having a volume of 84% relative to the total volume of the core solder ball, thereby manufacturing a Cu core solder ball.

Example 3: Manufacture of Metal Core Solder Ball

Cu was melted via induction heating using a high frequency induction furnace and then passed through a predetermined orifice hole using an oscillator, thus manufacturing a Cu core having a diameter of 100 μm. As such, the frequency was 150 Hz, and the pressure was 5 bar.

The Cu core was pickled, treated with a Pd solution so that a Pd seed was attached to the etched surface thereof, and then activated with a 15% dilute sulfuric acid solution. Thereafter, the Cu core was loaded into a Ni electroless plating solution heated in a water bath and then stirred until the reaction was completed.

As such, the amount of the loaded Cu core was 180 g, and pH of the Ni plating solution was 4~6. The reaction continued until the total volume of the Ni electroless plating solution was decreased to ½.

The reaction was further carried out for about 1 hr, thus forming a first plating layer about 1 μm thick having a volume of 0.00075% relative to the total volume of the core solder ball.

The Cu core having the first plating layer was placed in a barrel, and Sn—Ag was positioned at the anode and the Cu core was located at the cathode and thus electroplating was performed. As such, the temperature was maintained at 20~30° C. This electroplating was performed at a current density of 1 A/dm for 3 hr, thus forming a second plating layer 30 μm thick on one side having a volume of 71% relative to the total volume of the core solder ball, thereby manufacturing a Cu core solder ball.

Comparative Example 1: Manufacture of Solder Ball

As a micro solder ball, a Sn3.0Ag0.5Cu solder ball having a diameter of 100 μm was manufactured by passing molten solder through a 60 μm orifice while uniformly vibrating it using an oscillator. As such, the pressure which was applied to the melt was about 3 bar, and the frequency was set to 7 KHz.

Comparative Example 2: Manufacture of Metal Core Solder Ball

Cu was melted via induction heating using a high frequency induction furnace and then passed through a predetermined orifice hole using an oscillator, thus manufacturing a Cu core having a diameter of 40 µm. As such, the frequency was 200 Hz, and the pressure was 10 bar.

The Cu core was pickled, treated with a Pd solution so that a Pd seed was attached to the etched surface thereof, and then activated with a 15% dilute sulfuric acid solution. Thereafter, the Cu core was loaded into a Ni electroless plating solution heated in a water bath and then stirred until the reaction was completed.

As such, the amount of the loaded Cu core was 10 g, and pH of the Ni plating solution was 4~6. The reaction continued until the total volume of the Ni electroless plating solution was decreased to 1/10.

The reaction was further carried out for about 1 hr, thus forming a first plating layer about 1 µm thick having a volume of 0.01% relative to the total volume of the core solder ball.

The Cu core having the first plating layer was placed in a barrel, and Sn—Pb was positioned at the anode and the Cu core was located at the cathode and thus electroplating was performed. As such, the temperature was maintained at 20~30° C. This electroplating was performed at a current density of 1 A/dm for 3 hr, thus forming a second plating layer 40 µm thick on one side having a volume of 96% relative to the total volume of the core solder ball, thereby manufacturing a Cu core solder ball.

The data results of Examples 1 to 3 and Comparative Examples 1 to 3 are summarized in Table 1 below.

TABLE 1

| | Orifice | Core ( ) | Frequency (Hz) | Pressure (bar) | Loaded amount (g) | PH | Thick. ( ) | $1^{st}$ Plating layer Relative to total volume (%) | Current density (A/dm2) | Time (hr) | Thick. ( ) | $2^{nd}$ Plating layer Relative to total volume (%) | Final size ( ) |
|---|---|---|---|---|---|---|---|---|---|---|---|---|---|
| Ex. 1 | | 40 | 200 | 10 | 10 | 4~6 | 1 | 0.01 | 1 | 3 | 30 | 91 | 100 |
| Ex. 2 | | 60 | 180 | 8 | 40 | 4~6 | 1 | 0.003 | 1 | 3 | 30 | 84 | 120 |
| Ex. 3 | | 100 | 150 | 5 | 180 | 4~6 | 1 | 0.00075 | 1 | 3 | 30 | 71 | 160 |
| C. Ex. 1 | 60 | 100 | 7000 | 3 | | | | | | | | | 100 |
| C. Ex. 2 | | 40 | 200 | 10 | 10 | 4~6 | 1 | 0.01 | 1 | 3 | 40 | 95 | 120 |
| C. Ex. 3 | | 40 | 200 | 10 | 10 | 9~10 | 1 | 0.01 | | 3 | 40 | 96 | 120 |

The reaction was further carried out for about 1 hr, thus forming a first plating layer about 1 µm thick having a volume of 0.01% relative to the total volume of the core solder ball.

The Cu core having the first plating layer was placed in a barrel, and Sn—Ag was positioned at the anode and the metal core was located at the cathode and thus electroplating was performed. As such, the temperature was maintained at 20~30° C. This electroplating was performed at a current density of 1 A/dm for 3 hr, thus forming a second plating layer 40 µm thick on one side having a volume of 95% relative to the total volume of the core solder ball, thereby manufacturing a Cu core solder ball.

Comparative Example 3: Manufacture of Metal Core Solder Ball

Cu was melted via induction heating using a high frequency induction furnace and then passed through a predetermined orifice hole using an oscillator, thus manufacturing a Cu core having a diameter of 40 µm. As such, the frequency was 200 Hz, and the pressure was 10 bar.

The Cu core was pickled, treated with a Pd solution so that a Pd seed was attached to the etched surface thereof, and then activated with a 15% dilute sulfuric acid solution. Thereafter, the Cu core was loaded into a Co electroless plating solution heated in a water bath and then stirred until the reaction was completed.

As such, the amount of the loaded Cu core was 10 g, and pH of the Co plating solution was 9~10. The reaction continued until the total volume of the Co electroless plating solution was decreased to 1/2.

Examples 4 to 6: Heat Dissipation Structure for Semiconductor Device

The metal core solder ball of each of Examples 1 to 3 was heated and attached to the connection terminal of a semiconductor device, and then connected to the electrode of a substrate. The connection terminal 110 of the semiconductor device includes a Cu pad 111 and Ni/Au plating layers 112, 113, and the electrode 150 of the substrate is formed of Cu.

A solder paste containing brass powder applied onto the electrode 150 of the substrate was melted thus forming a bonding portion 140 under the solder ball 130. The bonding portion 140 includes brass powder 141 (FIG. 1).

Comparative Examples 4 to 6: Heat Dissipation Structure for Semiconductor Device The solder ball of each of Comparative Examples 1 to 3 was heated and attached to the connection terminal of a semiconductor device, and then connected to the electrode of a substrate. The connection terminal of the semiconductor device includes a Cu pad and Ni/Au plating layers, and the electrode of the substrate is formed of Cu.

A solder paste applied onto the electrode of the substrate and the solder ball (Comparative Example 4) or the second plating layer of the solder ball (Comparative Examples 5 and 6) were melted thus forming a bonding portion under the solder ball.

TEST EXAMPLES

Test Example 1: Bonding Strength and Heat Conductivity

In order to evaluate bonding strength of the solder balls of the examples and comparative examples, each solder ball was connected to the electrode of a Cu pad. The connected products were subjected to shear evaluation.

An instrument for evaluating shear force was DAGE4000 available from DAGE, and evaluation was carried out under conditions of a test speed of 200 μm/s and a shear height of 50 μm. The number of balls used for evaluation was 20, and the measured values were averaged.

Also, heat conductivity was measured using a laser flash method in such a manner than one side of a small disc was heated using a laser and the time required to transfer heat to the other side of the disc was measured using an IR sensor. An instrument for measuring heat conductivity was LAF457 available from NERZCH, and the heating rate was 10° C./min.

The bonding strength and heat conductivity results of the examples and comparative examples are summarized in Table 2 below. In the examples according to the present invention, both bonding strength and heat conductivity are superior.

TABLE 2

|  | Strength (gf) | Heat conductivity (W/mK) | a (W/mK) | A | b (W/mK) | B | c (W/mK) | C | aA + bB + cC |
|---|---|---|---|---|---|---|---|---|---|
| Ex. 1 | 127.4 | 291.145 | 401 | 0.0999 | 90 | 0.0001 | 33 | 0.9 | 69.7689 |
| Ex. 2 | 128.6 | 294.548 | 401 | 0.15997 | 90 | 0.00003 | 33 | 0.84 | 91.87067 |
| Ex. 3 | 126.7 | 298.348 | 401 | 0.28999 | 90 | 0.0000075 | 33 | 0.71 | 139.7176675 |
| C. Ex. 1 | 132.5 | 54.195 |  |  |  |  |  |  | 0 |
| C. Ex. 2 | 118.4 | 248.258 | 401 | 0.0499 | 90 | 0.0001 | 33 | 0.95 | 51.3689 |
| C. Ex. 3 | 106.3 | 226.637 | 401 | 0.0399 | 90 | 0.0001 | 50 | 0.96 | 64.0089 |

Test Example 2: Drop Impact Test

A metal core ball and a solder ball were soldered to OSP(P)-OSP(B), and then subjected to a drop impact test. To this end, an instrument was SD10 available from LAB. FIG. 2 is a graph illustrating the results of drop impact testing, wherein four boards each having 15 units (a total of 60 units) were subjected to drop impact testing (under conditions of 1,500 G 400 drop), and the results thereof were represented by a Weibull distribution. Thus, 1%, 5%, 10%, 63.2% failure estimates are given in Table 3 below.

TABLE 3

|  | 1% failure | 5% failure | 10% failure | 63.2% failure |
|---|---|---|---|---|
| Ex. 1 | 29 | 66 | 95 | 289 |
| Ex. 2 | 31 | 67 | 93 | 262 |
| Ex. 3 | 28 | 58 | 80 | 214 |
| C. Ex. 1 | 14 | 31 | 44 | 131 |
| C. Ex. 2 | 19 | 48 | 71 | 246 |
| C. Ex. 3 | 18 | 36 | 48 | 122 |

Test Example 3: Observation of Kirkendall Voids

In order to observe Kirkendall voids, Example 1 and Comparative Example 1 were connected respectively to the electrode pads, and then thermally treated, after which the bonding layers thereof were observed. The results are illustrated in FIG. 3. As illustrated in FIG. 3, in the case of a typical solder ball, the generation of Kirkendall voids was increased in proportion to an increase in thermal treatment time. However, in the case of the metal core solder ball, the generation of Kirkendall voids was controlled because of the presence of the first plating layer, compared to the typical solder ball.

As described hereinbefore, the present invention provides a metal core solder ball and a heat dissipation structure for a semiconductor device using the same. According to the present invention, the metal core solder ball designed to have high heat conductivity is used thus achieving both high bonding reliability and heat dissipation performance.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An electrically connecting and heat dissipation structure for a semiconductor device comprising:
    a connection terminal of the semiconductor device;
    an electrode of a substrate facing the connection terminal;
    a solder ball comprising a metal core having a diameter of 40-600 μm, a first plating layer formed on an outer surface of the metal core, and a second plating layer formed on an outer surface of the first plating layer and comprising an SnAgCu, SnCu, SnMg, or SnAl alloy; and
    a bonding portion comprising solder paste brass powder between the electrode of the substrate and the solder ball,
    wherein the $$\frac{1}{6}a < aA + bB = cC < \frac{2}{3}a,$$

solder ball satisfies the relation
    wherein a is heat conductivity (W/mK) of the metal core, b is heat conductivity (W/mK) of the first plating layer, c is heat conductivity (W/m) of the second plating layer, A, B and C are volume ratios of the metal core, the first plating layer and the second plating layer, respectively, in the solder ball, $A+B+C=1$, $0.000005 < B < 0.0005$, $0.71 < C < 0.94$, and A, B and C each are a real number between 0 and 1, and
    wherein the solder ball and the bonding portion connects electrically between the connection terminal and the electrode of the substrate, and dissipates heat from the semiconductor device to the substrate.

2. An electronic device, comprising the electrically connecting and heat dissipation structure of claim 1.

* * * * *